United States Patent [19]

Aoki et al.

[11] Patent Number: 4,978,412
[45] Date of Patent: Dec. 18, 1990

[54] PLASMA PROCESSING DEVICE

[75] Inventors: Makoto Aoki, Yokohama; Yoshifumi Tahara, Yamato; Izumi Arai, Yokohama, all of Japan

[73] Assignee: Tokyo Electron Limited, Tokyo, Japan

[21] Appl. No.: 505,453

[22] Filed: Apr. 6, 1990

[30] Foreign Application Priority Data

Apr. 11, 1989 [JP] Japan .................................. 1-90954

[51] Int. Cl.$^5$ .................. B44C 1/22; C23C 14/00; B05B 5/02; C03C 15/00
[52] U.S. Cl. .................. 156/345; 118/50.1; 118/620; 118/728; 156/643; 204/298.31
[58] Field of Search .................. 156/643, 646, 345; 427/38, 39; 118/728, 729, 50.1, 620; 204/192.1, 192.12, 192.32, 298

[56] References Cited

U.S. PATENT DOCUMENTS 4,615,755 10/1986 Tracy et al. .................. 156/345
4,842,683 6/1989 Cheng et al. .................. 156/345
4,931,135 6/1990 Horiuchi et al. .................. 156/643

Primary Examiner—William A. Powell
Attorney, Agent, or Firm—Oblon, Spivak, McClelland, Maier & Neustadt

[57] ABSTRACT

A plasma processing device intended to plasma-process a wafer which is mounted on a mount in the plasma process vessel and clamped at the peripheral rim thereof between a clamping member and the mount. The wafer thus processed can be then handled when it is released from its clamped state. A plate spring is housed like a cantilever in a part of that portion of the clamping member which clamps the wafer relative to the mount, and a free end of the plate spring is projected from a recess which is formed on the underside of the clamping member to house the free end. When the wafer is clamped between the clamping member and the mount, the free end is housed in the recess, but when the wafer is released from its clamped state, the free end is projected from the recess to separate it from the clamping member. The wafer can therefore be left on the mount without adhering to the clamping member.

12 Claims, 5 Drawing Sheets

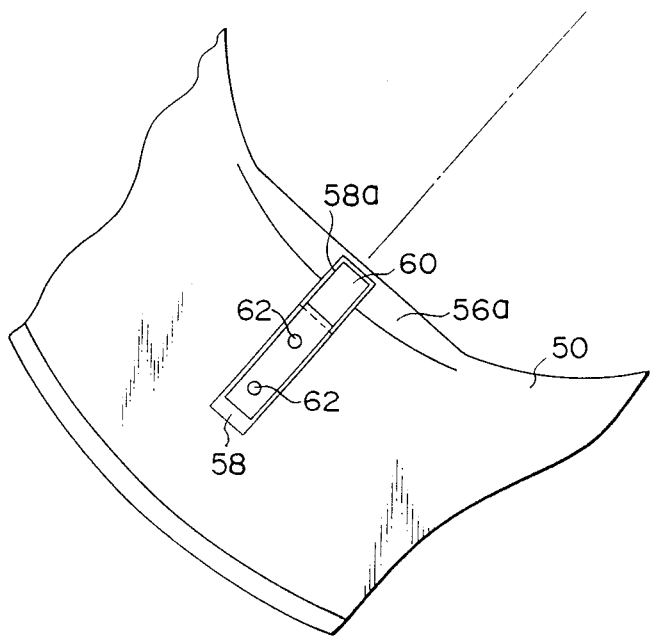
F I G. 5
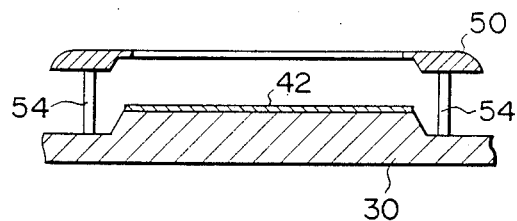
F I G. 6
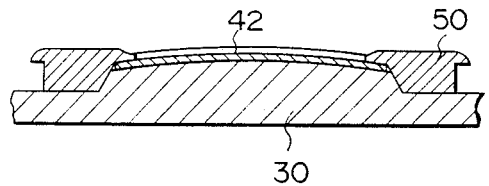
F I G. 7

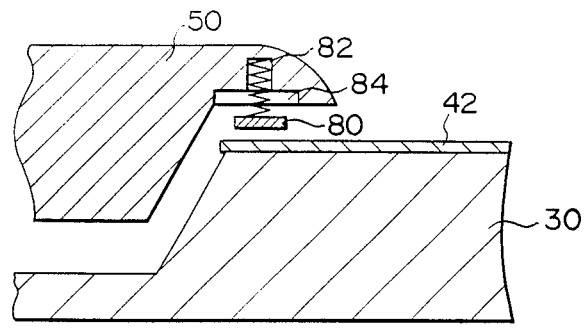
F I G. 8
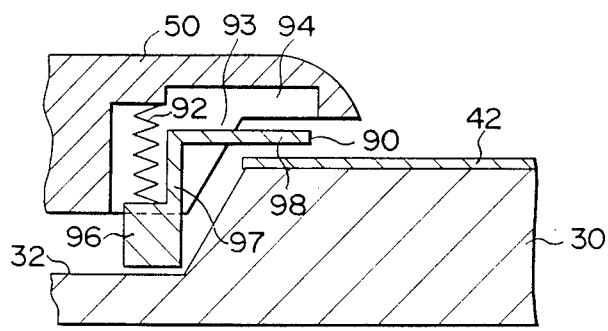
F I G. 9
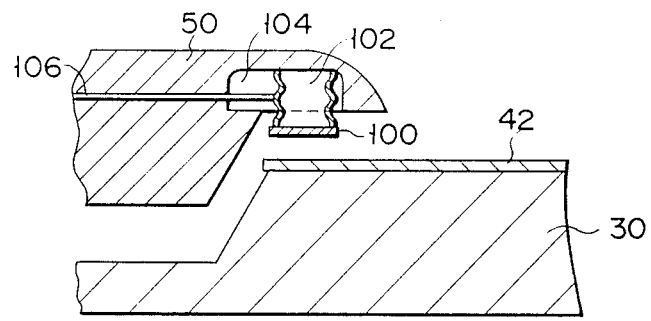
F I G. 10

PLASMA PROCESSING DEVICE

BACKGROUND OF THE INVENTION

1. Field of the Invention

The present invention relates to a plasma processing device.

2. Description of the Related Art

In the case of the plasma processing device such as plasma etching and CVD devices, an object to be processed is mounted on a mount in the plasma process vessel and plasma-processed while keeping the object clamped at the peripheral rim thereof between a clamping member and the mount.

In the case of the plasma etching device, for example, a semiconductor wafer 72 to be processed is mounted on the top of a lower electrode 70 which is opposed to an upper electrode (not shown), and it is fixed there by clamping its peripheral rim between a clamping member 74 and the lower electrode 70, as shown in FIG. 1A. When it is to be carried out of and into the plasma process vessel, rods 76 related to the clamping member 74 are extended to lift the clamping member 74 so as to release it from its clamped state, as shown in FIG. 1B.

The wafer 72 to be processed is usually exposed to plasma in the plasma process vessel. Charge is thus stored in it during the plasma process. In short, it is charged up.

When the clamping member 74 is lifted, as shown in FIG. 1B, to release the wafer 72 from its clamped state after this plasma process is finished, the semiconductor wafer 72 thus charged up adheres electro-statically to the clamping member 74. The wafer 72 must remain on the top of the lower electrode 70, as shown by a solid line in FIG. 1B, after it is released from its clamped state, but it is sometimes lifted together with the clamping member 74, as shown by a two-dot and dash line in FIG. 1B, electrostatically adhering to the clamping member 74. When it is lifted together with the clamping member 74 in this manner, it becomes impossible to carry it out of the plasma process vessel and set a new one there. This makes it necessary for the operator to

SUMMARY OF THE INVENTION

The object of the present invention is therefore to provide a plasma processing device capable of surely separating a processed object from a clamping member and smoothly handling it after it is released from the state of its being clamped between the clamping member and a mount even if it is charged up while being exposed to plasma.

This object of the present invention can be achieved by a plasma processing device wherein a object to be processed can be mounted on a mount in the plasma process vessel, plasma-processed under such a state that the object is held between a clamping member and the mount at the peripheral rim thereof, and then handled after the object is released from the state of its being held between the clamping member and the mount, characterized in that the clamping member is provided with a means for adding force to the object to separate it from the clamping member at least when it is to be released from its held state.

According to the present invention, force is added to the object to release it from the clamping member at least when it is to be released from its clamped state. Even if it is charged up because it is exposed to plasma during the plasma process, therefore, force larger than the electrostatic force with which it tends to adhere to the clamping member can be added to it in such a direction that it can be separated from the clamping member. After it is released from its clamped state, therefore, it can be surely left on the mount so as to make it smooth to handle it.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIG. 5 shows a part of the underside of the clamping member provided with the force adding means;

FIG. 6 shows a wafer, which has been held between a lower electrode and the clamping member, released from its held state;

FIG. 7 shows the top of a lower electrode, on which a wafer is to be mounted, a little swelled upward;

FIGS. 8 through 10 show second to fourth examples of the means for adding force to a wafer so as to release it from the clamping member.

DETAILED DESCRIPTION OF THE PREFERRED EMBODIMENTS

An embodiment of the present invention in which the present invention is applied to the plasma etching device of the parallel-plate type will be described with reference to the drawings.

Figure 1A:
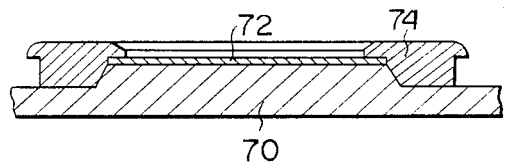
FIGS. 1A and 1B show a wafer to be processed, in a held state and in a released state respectively, in the case of the conventional device.
Figure 1B:
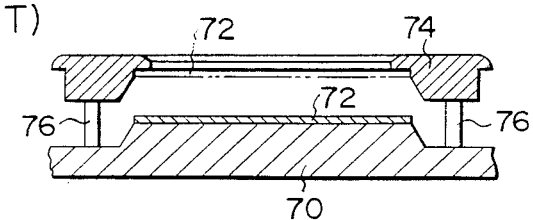
Figure 2:
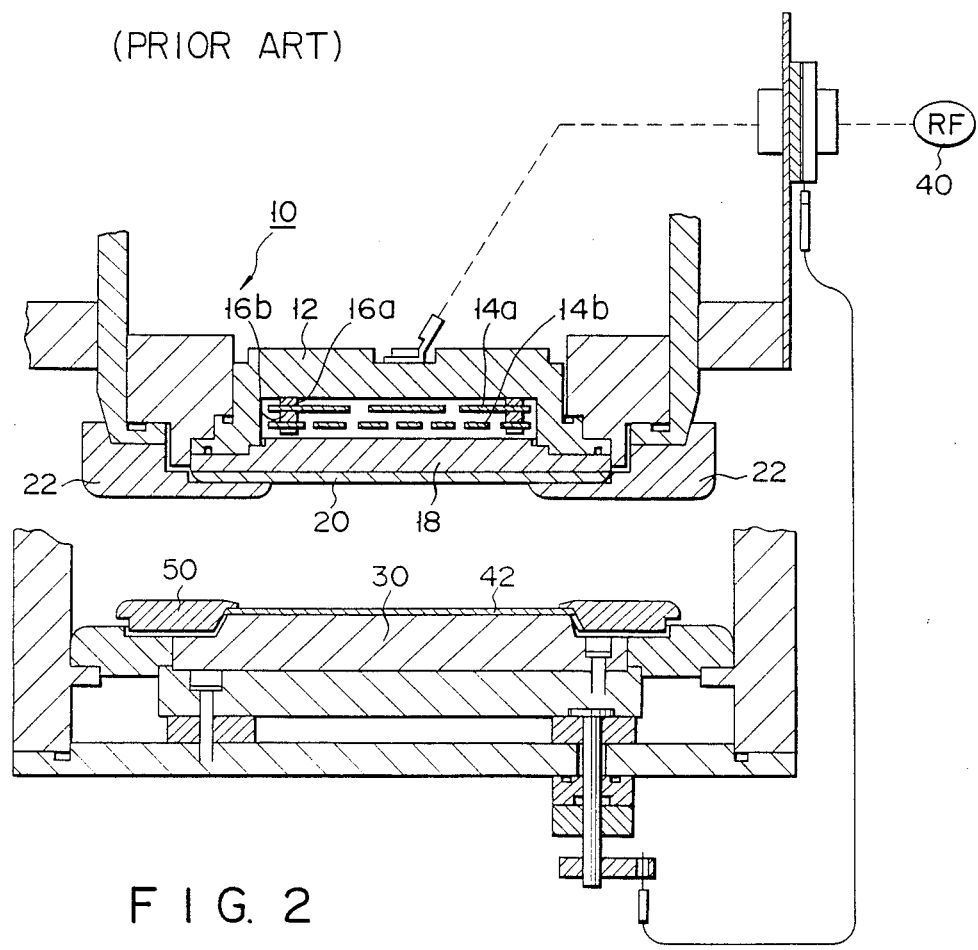
FIG. 2 is a sectional view showing a plasma etching device to which the present invention is applied.

The plasma etching device shown in FIG. 2 has a upper and a lower electrode 10 and 13 opposed to each other. A wafer 42 which is to be etched is mounted on the top of the lower electrode 30 and RF power of 380 KHz is applied between the upper 10 and the lower electrode 30 by an RF power source 40. Etching gas is introduced through the upper electrode 10 and the wafer 42 is etched by plasma thus generated between the upper 10 and the lower electrode 30.

The upper electrode 10 has a conductive cooling member 12 shaped like a flange and a cable extending from the RF power source 40 is connected to the cooling member 12.

First and second diffusion plates 14a and 14b each having a plurality of holes are separated parallel to each other by spacers 16a and 16b and housed in a recess on the underside of the cooling member 12. A reinforcing plate 18 and then an amorphous silicon electrode 20 close the recess on the underside of the cooling member 12. A shield ring 22 covers the peripheral rim of the amorphous silicon electrode 20 to define the diameter of that area of the electrode 20 which is exposed to plasma.

The wafer 42 which is to be etched can be mounted on that top of the lower electrode 30 which is projected upward like a disk. A ring-shaped clamping member 50 is arranged along the disk-like top of the lower electrode 30 to clamp the periphery rim of the wafer 42 between the clamping member 50 and the lower electrode 30 and to fix it between them. The lower electrode 30 is earthed.

FIG. 7 shows a variation of the top of the lower electrode 30 which is a little swelled upward to form a curved surface, preferably an uniform load surface. When the top of the lower electrode 30 is shaped like this, the wafer pressed by the clamping member 50 can be evenly contacted with the top of the lower electrode 30 all over its underside. The whole of the wafer can be thus uniformly charged.

The upper 10 and the lower electrode 30 arranged parallel to and separated from each other are housed in a plasma processing chamber, as described above, to thereby form the etching device of the parallel-plate type.

The clamping member 50 which is characteristic of the present invention will be described referring to FIGS. 3 through 5.

The clamping member 50 is shaped like a ring having a cut-away portion 50a at the center thereof through which the wafer 42 is exposed to plasma. Four through-holes 52 are formed adjacent to the outer peripheral rim of the clamping member 50 and lift rods 54 shown in FIG. 6 are arranged in these through-holes 52. A ring-shaped projection 56 is formed along the inner rim of the clamping member 50 to cover the peripheral rim of the wafer 42 and a part of this ring-shaped projection 56 is made wide to form a wide portion 56a intended to widen its area which is contacted with the wafer 42.

A means for adding force to the wafer 42 so as to release it from the clamping member 50 according to the present invention is provided to that underside of the clamping member 50 which corresponds to the wide portion 56a of the ring-shaped projection 56. An arrangement of the force adding means will be described referring to FIG. 3, a sectional view taken along a line III—III in FIG. 4, and also referring to FIG. 5 showing the underside of the wide portion 56a of the ring-shaped projection 56.

According to the present invention, a crank-shaped plate spring 60 is used as the force adding means. A recess 58 for housing the plate spring 60 is formed on the underside of the clamping member which corresponds to the wide portion 56a of the projection 56.

A part of the plate spring 60 is fixed to a stepped portion of the recess 58 by means of two screws 62. The free end thereof is tilted at an angle of 15° relative to the horizontal line, as shown in FIG. 3. When the wafer 42 is held between the clamping member 50 and the lower electrode 30, the free end of the plate spring 60 is pushed by the wafer 42 and kept horizontal against the urging force of the plate spring 60. Another recess 58a for housing the free end of the plate spring 60 is formed on the underside of the clamping member 50 so as to keep the underside of the free end of the plate spring 60 same in level as that of the ring-shaped projection 56.

The wafer 42 is etched in such a way that RF power is applied from the RF power source 40 between the upper 10 and the lower electrode 30 while etching gas is being introduced between them through the upper electrode 30, that plasma is thus excited between them and radicals developed in this plasma are stuck on the surface of the wafer 42 to create chemical reaction, and that ions decomposed in the plasma are accelerated by electric field formed between the parallel-plate electrodes to collide with the wafer 42. According to the etching of this parallel-plate type, side etching is reduced and etching, high in anisotropy, can be realized. This enables micro-patterns to be etched.

As shown in FIG. 2, the wafer 42 is mounted on the top of the lower electrode 10 and its peripheral rim is held between the clamping member 50 and the lower electrode 30 during the plasma process. The clamping member 50 has the circular cut-away portion 50a at the center thereof. The wafer 42 can be therefore exposed to plasma through this cut-away portion 50a of the clamping member 50 and plasma etching can be applied to this exposed area of the wafer 42, while the plasma process is being conducted.

During the plasma process, ions decomposed in the plasma physically collide with the wafer 42, which is one of etching actions. Charge is thus stored in the wafer 42. In other words, the wafer 42 is charged up.

When the plasma process is finished, rods 54 fixed to the underside of the clamping member 50 are lifted, as shown in FIG. 6, to release the wafer 42 from its state under which it is held between the clamping member 50 and the lower electrode 30.

Figure 3:
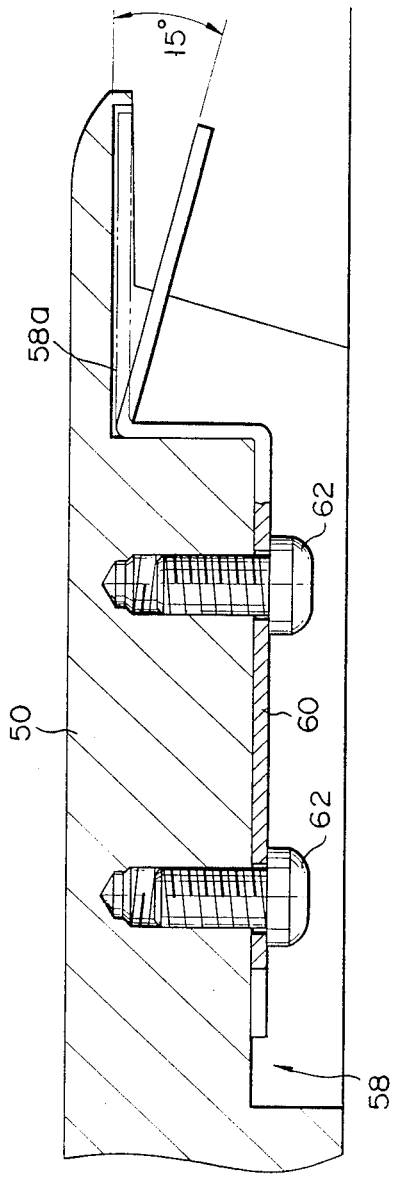
FIG. 3 is a sectional view taken along a line III—III in FIG. 4, showing a first example of the means for adding force to a wafer so as to release it.
Figures 4A, 4B:
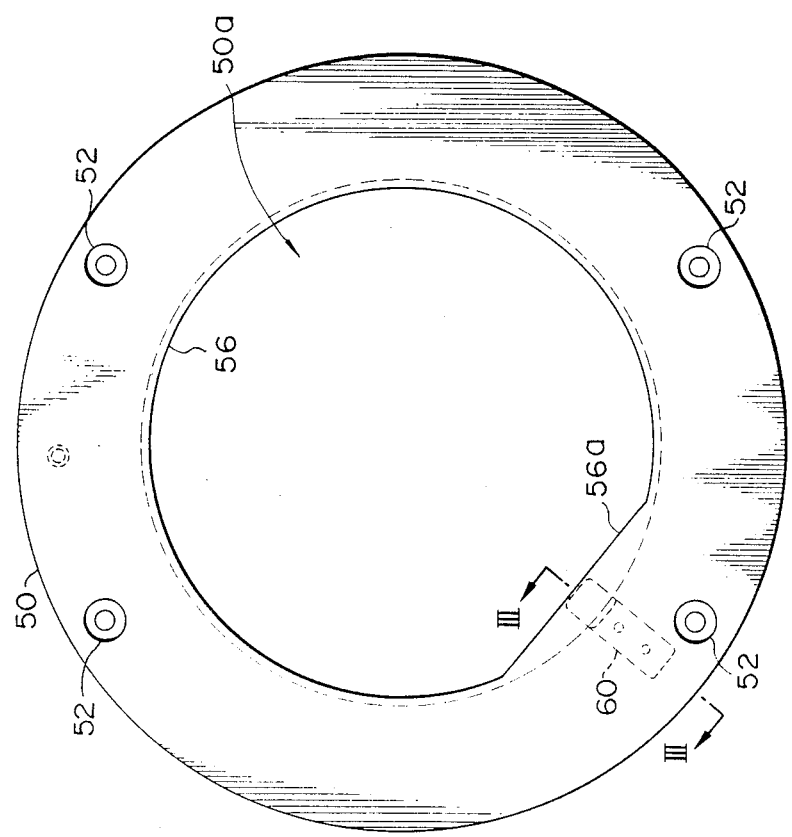
FIGS. 4A and 4B are plan and sectional views showing a clamping member provided with the force adding means.

When the wafer 42 is held between the clamping member 50 and the lower electrode 30, the tilted free end of the plate spring 60 is deformed and kept horizontal, as shown by a two-dot and dash line in FIG. 3, due to wafer-holding force created between the clamping member 50 and the lower electrode 30. When the clamping member 50 is lifted as described above, however, this wafer-holding force is eliminated so that the free end of the plate spring 60 which has been kept horizontal can return to its original state due to its elasticity. The free end of the plate spring 60 pushes the wafer 42 downward in FIG. 3 while returning to its original state. This causes force to be added to the wafer 42 in such a direction that the wafer 42 can be separated from the underside of the clamping member 50.

Even if the wafer 42 is charged up during the plasma process, therefore, force larger than the electrostatic force with which the wafer 42 tends to adhere to the clamping member 50 can be added to the wafer 42 by the plate spring 60. This enables the wafer 42 to be forcedly separated from the underside of the clamping member 50.

When the wafer 42 is separated at a part thereof from the clamping member 50, electrostatic force is reduced at the remaining area thereof. Even when the force adding means is arranged only at a part of the clamping member in this embodiment, therefore, the wafer 42 can be surely left on the top of the lower electrode 30 after the wafer-holding force created between the clamping member 50 and the lower electrode 30 is eliminated.

The wafer 42 which is separated from the clamping member 50 and left on the top of the lower electrode 30, as described above, can be exchanged with a new one, which is to be plasma-processed, by means of a wafer handler such as the pincette (not shown). When this operation of exchanging the processed wafer with a new one is repeated together with the plasma process, a plurality of the wafers can be successively plasma-processed. In addition, the wafers-exchanging operation cannot be interrupted because the wafers can be surely left on the top of the lower electrode 30 by the plate spring 60 after they are released from the wafer-holding force. The through-put of plasma-processing them can be increased accordingly.

FIGS. 8 through 10 show second to fourth examples of the force adding means which are intended to separate the wafer from the clamping member 50.

In the case of the second example shown in FIG. 8 a plate 80 attached to one end of a coil spring 82 is used instead of the plate spring 60 in the first example. The other end of the spring 82 is embedded in the wide portion 56a of the ring-shaped projection 56 (see FIG. 4A) and a recess 84, deeper than the thickness of the plate 80, is formed on the underside of the wide portion 56a to house the plate 80 therein.

When the wafer 42 is held between the lower electrode 30 and the clamping member 50, the spring 82 is compressed and the plate 80 is housed in the recess 84. When the clamping member 50 is lifted, the wafer 42 is released from the wafer-holding force. The plate 80 is thus projected from the recess 84 by the elasticity of the spring 82 so as to separate the wafer 42 from the underside of the clamping member 50.

FIG. 9 shows the third example in which a stepped plate 90 attached to one end of a coil spring 92 is used instead of the plate spring 60. The plate 90 includes a base 96 related to a flange 32 of the lower electrode 30, a vertical portion 97, and a horizontal portion 98 connected to the base 96 through the vertical portion 97 and related to the wafer 42. Recesses 93 and 94 are formed on the underside of the wide portion 56a of the ring-shaped projection 56 (see FIG. 4A) to house the spring 92, a part of the base 96, the vertical portion 97 and the horizontal portion 98 of the plate 90 therein.

When clamping member 50 is moved downward to the lower electrode 30 to hold the wafer 42 between them, the underside of the plate base 92 comes to contact the flange 32 of the lower electrode 30 and the spring 92 is compressed accordingly. When the spring 92 is compressed in this manner, the plate 90 is housed in the recess 93, keeping the horizontal portion 98 not contacted with the wafer 42. Namely, the horizontal portion 98 of the plate 90 is housed in the recess 94 not to contact the wafer 42 when the wafer 42 is under such condition that it is held between the clamping member 50 and the lower electrode 30. When the clamping member 50 is lifted, the plate base 96 is released from its contact with the flange 32 of the lower electrode 30 and the whole of the plate 90 is thus projected from the recess 93 by the elasticity of the spring 92. Therefore, the horizontal portion 98 of the plate 90 is also projected to separate the wafer 42, if it remains, from the underside of the clamping member 50.

The fourth example shown in FIG. 10 uses a plate 100 attached to the lower end of a metal bellows 102 instead of the plate spring 60. The bellows 102 is housed in a recess 104 formed on the underside of the wide portion 56a. of the ring-shaped projection 56 (see FIG. 4A). A flexible tube 106 is connected to the bellows 102 and pressurized air can be supplied into the bellows 102 through the tube 106.

When the wafer 42 is held between the lower electrode 30 and the clamping member 50, the bellows 102 is compressed and housed in the recess 104. When the clamping member 50 is to be lifted, air is supplied into the bellows 102 through the tube 106, synchronizing with the rising clamping member 50. The bellows 102 is thus extended to project the plate 100 from the recess 104, thereby causing the wafer 42 to be separated from the underside of the clamping member 50.

It should be understood that the present invention is not limited to the above-described embodiments and that various changes and modifications can be made without departing from the scope and spirit of the present invention.

The means for adding force to the wafer or processed object may change its shape, material and so on. It is however preferable to use such an urging member as the plate spring 60 which can separate the object from the clamping member without using any drive source.

The wafer may be separated from the clamping member using the force with which the rods 54 are driven upward. When the rising speed of the clamping member is made high, the inertia of the wafer 42 which is forced to remain on the top of the lower electrode 30 can be made larger than the electrostatic force with which the wafer 42 adheres to the clamping member 50. This can be combined with any of the above-described embodiments.

The force adding means used by the above-described embodiments is arranged only at a part of the clamping member. The force adding means of this type may be arranged at plural parts of the clamping member so as to more surely separate the wafer from the clamping member.

The present invention is not limited to the plasma etching device but it may be applied to various kinds of plasma process devices wherein the object charged up while being exposed to plasma is held between the clamping member and a mount and it is released from the clamping member every time it is exchanged with a new one in the plasma process vessel.

What is claimed is:

1. A plasma processing device wherein an object to be processed can be mounted on a mount in the plasma process vessel, plasma-processed under such a state that the object is held between a clamping member and the mount at the peripheral rim thereof, and then handled after the object is released from the state of its being held between the clamping member and the mount, characterized in that the clamping member is provided with means for adding force to the object to separate it from the clamping member at least when it is to be released from its held state.

2. The plasma processing device according to claim 1, wherein said force adding means comprises a member for always urging the object at a part of the area where the clamping member is contacted with the object, in such a direction that the object can be separated from the clamping member.

3. The plasma processing device according to claim 2, wherein said urging member is a plate spring supported like a cantilever by the clamping member while leaving one end thereof as a free end.

4. The plasma processing device according to claim 3, wherein a recess is formed on the underside of the clamping member to house the free end of the plate spring when the object is held between the clamping member and the mount.

5. The plasma processing device according to claim 2, wherein said urging member comprises a plate attached to one end of a coil spring.

6. The plasma processing device according to claim 5, wherein a recess is formed on the underside of the clamping member to house the plate when the object is held between the clamping member and the mount.

7. The plasma processing device according to claim 1, wherein said force adding means comprises a push member for adding force to the object at a part of the area where the clamping member is contacted with the object to release the object from the clamping member when the clamping member is separated from the mount.

8. The plasma processing device according to claim 7, wherein said push member comprises a plate opposite to the object and attached to one end of a coil spring, a recess is formed on the underside of the clamping member to house the plate, and when the object is to be held between the clamping member and the mount, said push member except its plate strikes against a flange of the mount to compress the spring so that the plate can be housed in the recess and left untouched with the object.

9. The plasma processing device according to claim 7, wherein said push member comprises a plate attached to one end of a bellows and a tube connected to the bellows, and when the clamping member is to be separated from the mount, air is supplied into the bellows through the tube so that the bellows can be extended to enable the plate to push the object.

10. The plasma processing device according to claim 1, wherein said force adding means is attached to the clamping member at plural positions thereof.

11. The plasma processing device according to claim 1, wherein the inertia of the object which forces the object to remain on the mount can be made larger than the electrostatic force with which the object tends to adhere to the clamping member by increasing the rising speed of the clamping member 12. The plasma processing device according to claim 1, wherein the top of the mount is swelled upward to form a curved surface.

* * * * *